(12) United States Patent
Hwang et al.

(10) Patent No.: US 9,130,066 B2
(45) Date of Patent: Sep. 8, 2015

(54) POWER FACTOR ENHANCED THERMOELECTRIC MATERIAL AND METHOD OF PRODUCING SAME

(71) Applicant: SAMSUNG ELECTRONICS CO., LTD., Suwon-si, Gyeonggi-Do (KR)

(72) Inventors: Sung Woo Hwang, Yongin-si (KR); Sang Il Kim, Seoul (KR); Byung Ki Ryu, Hwaseong-si (KR); Kyung Han Ahn, Uijeongbu-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 209 days.

(21) Appl. No.: 13/865,491

(22) Filed: Apr. 18, 2013

(65) Prior Publication Data

US 2013/0299754 A1    Nov. 14, 2013

(30) Foreign Application Priority Data

May 14, 2012  (KR) .................... 10-2012-0051149

(51) Int. Cl.
*H01L 35/00* (2006.01)
*C01B 19/00* (2006.01)
*H01L 35/16* (2006.01)

(52) U.S. Cl.
CPC .............. *H01L 35/00* (2013.01); *C01B 19/002* (2013.01); *C01B 19/007* (2013.01); *H01L 35/16* (2013.01); *C01P 2002/52* (2013.01); *C01P 2006/40* (2013.01)

(58) Field of Classification Search
CPC .............................. H01L 35/16; C01B 19/007
USPC ........................................ 252/62.3 T; 136/238
See application file for complete search history.

(56) References Cited

U.S. PATENT DOCUMENTS

| | | | |
|---|---|---|---|
| 5,726,381 A | 3/1998 | Horio et al. | |
| 5,883,563 A | 3/1999 | Horio et al. | |
| 2010/0258154 A1 | 10/2010 | Heremans et al. | |
| 2011/0017935 A1 | 1/2011 | Park et al. | |
| 2011/0079750 A1 | 4/2011 | Park et al. | |
| 2011/0079751 A1 | 4/2011 | Park et al. | |
| 2011/0100409 A1 | 5/2011 | Kim et al. | |
| 2012/0211045 A1 | 8/2012 | Park et al. | |
| 2012/0326100 A1 | 12/2012 | Park et al. | |

FOREIGN PATENT DOCUMENTS

| | | | |
|---|---|---|---|
| GB | 869584 | * | 5/1961 |
| JP | 08-111546 A | | 4/1996 |
| JP | 2003-133597 A | | 5/2003 |

(Continued)

OTHER PUBLICATIONS

Jong-Soo Rhyee et al., "Peierls distortion as a route to high thermoelectric performance in In4Se3-d crystals", Nature 08088, vol. 459, 2009, pp. 965-968.

(Continued)

*Primary Examiner* — Carol M Koslow
(74) *Attorney, Agent, or Firm* — Cantor Colburn LLP

(57) ABSTRACT

A thermoelectric material including a compound represented by Chemical Formula 1

$$M_xCu_yBi_{2-x}(Te_{1-z}Se_z)_3 \qquad (1)$$

wherein in the Chemical Formula, M is at least one metal element, and x, y, and z independently satisfy the following ranges $0<x\le0.1$, $0<y\le0.05$, and $0\le z\le0.5$.

12 Claims, 17 Drawing Sheets

(56) References Cited

FOREIGN PATENT DOCUMENTS

| JP | 4166927 B2 | 8/2008 |
| JP | 2011-516370 A | 5/2011 |
| WO | 2010024500 A1 | 3/2010 |

OTHER PUBLICATIONS

Supplemental Information, Nature 08088, vol. 459, 2009, pp. 1-10.
Wei-Shu Liu et al., "Thermoelectric Property Studies on Cu-Doped n-type $Cu_xBi_2Te_{2.7}Se_{0.3}$ Nanocomposites", Adv. Energy Mater., 2011, XX, p. 1-11.

\* cited by examiner

POWER FACTOR ENHANCED THERMOELECTRIC MATERIAL AND METHOD OF PRODUCING SAME

CROSS-REFERENCE TO RELATED APPLICATION

This application claims priority to and the benefit of Korean Patent Application No. 10-2012-0051149, filed on May 14, 2012, and all the benefits accruing therefrom under 35 U.S.C. §119, the content of which in its entirety is incorporated herein by reference.

BACKGROUND

1. Field

A highly efficient thermoelectric material having enhanced thermoelectric properties is disclosed.

2. Description of the Related Art

The thermoelectric phenomenon is a reversible and direct energy conversion between heat and electricity, and is caused by movement of electrons and holes inside a material.

The thermoelectric phenomenon is classified into the Peltier effect and the Seebeck effect. The Peltier effect can be used to provide cooling by using a temperature difference between ends of a thermoelectric material. The temperature difference is driven by an externally applied electric current. The Seebeck effect can be used to provide electricity generation by using an electromotive force generated from a temperature difference between ends of a thermoelectric material. The applied temperature difference causes charged carriers to diffuse from a hot side to a cold side. Charged carriers migrating to the cold side leave behind their oppositely charged nuclei, which causes a thermoelectric voltage.

Recently, a thermoelectric material has been applied to provide an active cooling system for semiconductor equipment and other heat generating electronic devices having a thermal management needs that are difficult to satisfy with a passive cooling system. Thermoelectric coolers are increasingly being used where suitable thermal management is difficult to provide with a conventional coolant gas compression system, such as a temperature control system for DNA analysis, where precise temperature control is desirable.

Thermoelectric cooling avoids the use of a coolant gas that causes an environmental problem, and causes no vibration or noise, and thus is environmentally friendly. However, there remains a need for a thermoelectric material with improved efficiency to provide improved cooling efficiency, so that thermoelectric cooling may be more widely applied to residential or commercial cooling, such as for a freezer, an air conditioner, and the like.

In addition, a thermoelectric material can be used to generate electricity due to a temperature difference between ends of the thermoelectric material when used where heat is discharged, e.g., in an auto engine, an industrial factory, and the like, and thus has gained attention as a new energy source.

Such thermoelectric generation systems have already been used in space explorers to Mars, Saturn, and the like, which cannot use solar energy.

SUMMARY

A thermoelectric material having an enhanced power factor, particularly a Bi—Te—Se-based thermoelectric material having an enhanced power factor, and a method of producing the same are provided.

A highly efficient thermoelectric device including the Bi—Te—Se-based thermoelectric material is provided.

In an embodiment, a thermoelectric material includes a compound represented by Chemical Formula 1

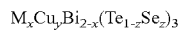
$$M_xCu_yBi_{2-x}(Te_{1-z}Se_z)_3 \tag{1}$$

wherein in Chemical Formula 1, M is at least one metal element, and x, y, and z independently satisfy the ranges $0<x\le0.1$, $0<y\le0.05$, and $0\le z\le0.5$.

According to an embodiment, M in Chemical Formula 1 is at least one metal element selected from Ag, Au, Pd, Mg, Al, Ge, In, Ga, Cd, Yb, and Eu.

According to another embodiment, a thermoelectric device including the thermoelectric material including the compound represented by Chemical Formula 1 is provided.

According to another embodiment, a thermoelectric module including the thermoelectric device is provided.

Still another embodiment provides a method of producing a bulk thermoelectric material using starting materials having the composition of Chemical Formula 1.

The thermoelectric material having increased thermoelectric properties may increase the performance of a cooling and heating system, and of a thermoelectric electricity generator system, which include the thermoelectric module.

In particular, a thermoelectric material of which the power factor is enhanced may be provided, and thus the thermoelectric figure of merit when adopting an additional method such as nano-structuralization and the like may be further improved.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
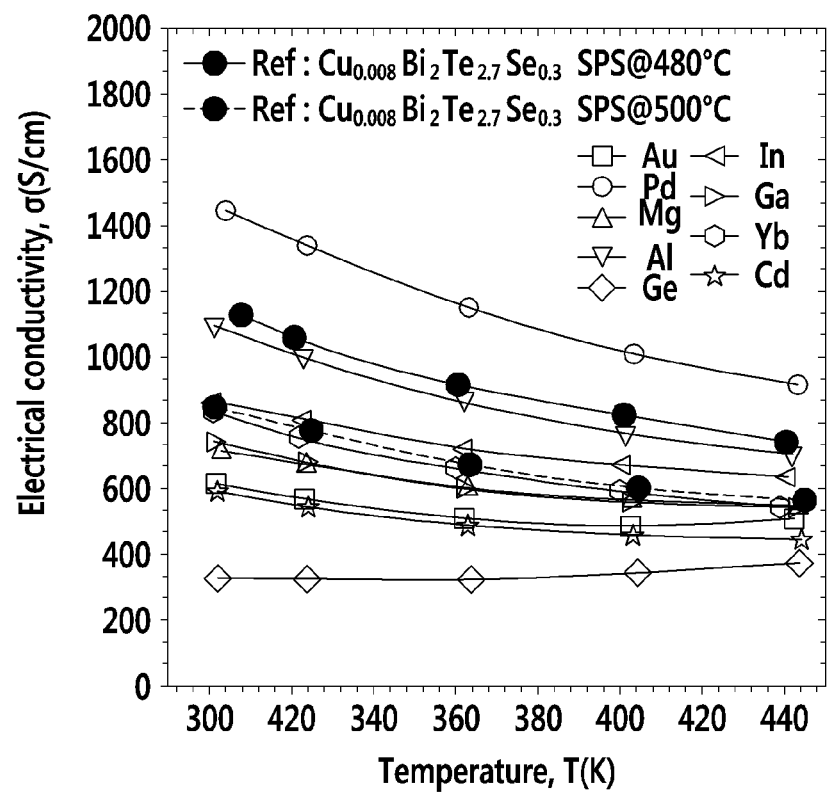
FIG. 1 is a graph of electrical conductivity (Siemens per centimeter, S/cm) versus temperature (Kelvin, K) of a thermoelectric material of the formula $M_xCu_yBi_{2-x}(Te_{1-z}Se_z)_3$ wherein M is Au, Pd, Al, Mg, Ga, Ge, In, Yb, or Cd, x=0.02, y=0.008, and z=0.1.
Figure 2:
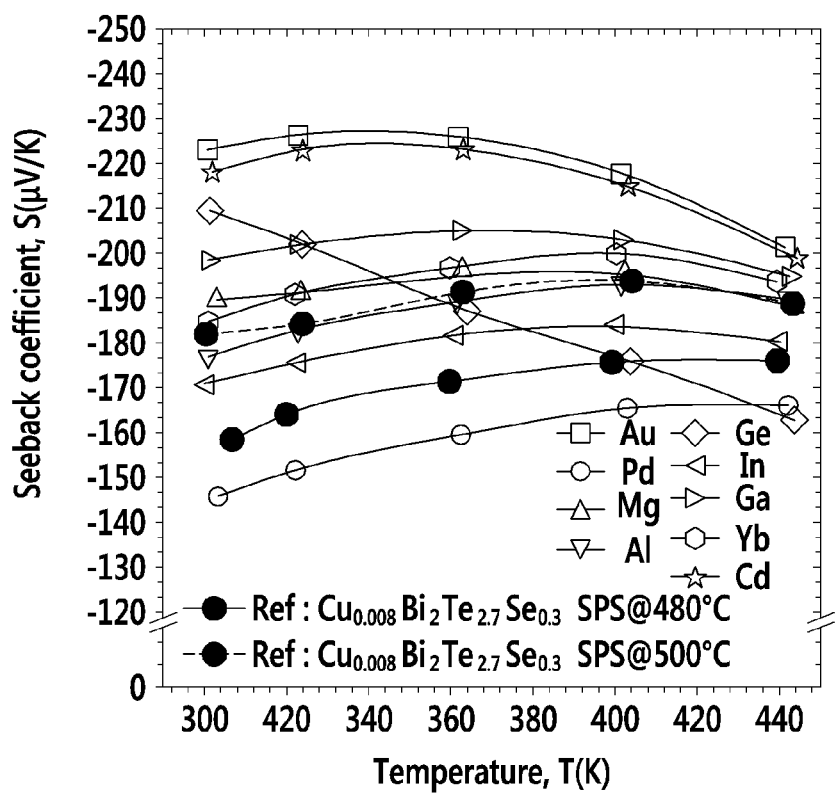
FIG. 2 is a graph of Seebeck coefficient (microvolts per Kelvin, μV/K) versus temperature (Kelvin, K) for the thermoelectric material of the formula $M_xCu_yBi_{2-x}(Te_{1-z}Se_z)_3$ wherein M is Au, Pd, Al, Mg, Ga, Ge, In, Yb, or Cd, x=0.02, y=0.008, and z=0.1.
Figure 3:
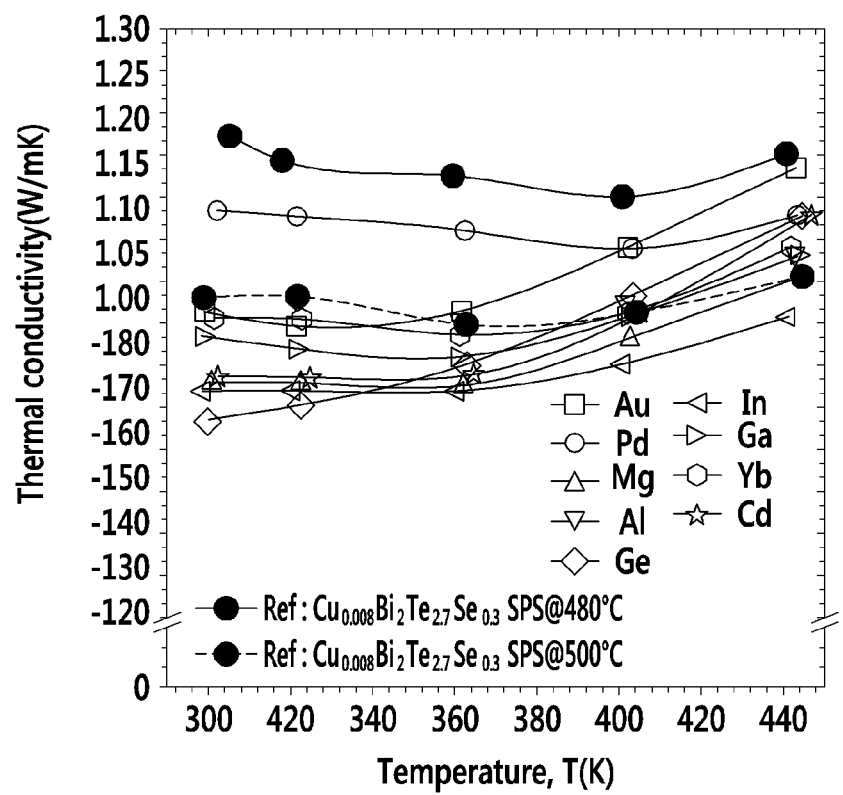
FIG. 3 is a graph of thermal conductivity (Watts per milliKelvin, W/mK) versus temperature (Kelvin, K) for the thermoelectric material of the formula $M_xCu_yBi_{2-x}(Te_{1-z}Se_z)_3$ wherein M is Au, Pd, Al, Mg, Ga, Ge, In, Yb, or Cd, x=0.02, y=0.008, and z=0.1.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Group" means a group of the Periodic Table of the Elements according to the International Union of Pure and Applied Chemistry ("IUPAC") Group 1-18 group classification system.

The "lanthanide elements" are the chemical elements with atomic numbers 57 to 71.

A "metal element" means a metal of Groups 1-16 of the Periodic Table of the Elements.

For convenience, the term "mixture" is used to refer to any combination of two different materials irrespective of the form, and thus includes solutions, dispersions, emulsions, alloys, physical mixtures, and the like.

According to an embodiment, a thermoelectric material comprising a compound represented by Chemical Formula 1 is provided.

$$M_xCu_yBi_{2-x}(Te_{1-z}Se_z)_3 \qquad (1)$$

Specifically, in Chemical Formula 1, the M is at least one metal element, and the x, y, and z are respectively in the following ranges: $0<x\le0.1$, $0<y\le0.05$, and $0\le z\le0.5$.

According to an embodiment, in Chemical Formula 1, M is at least one metal element selected from Groups 2, 10-14, and a lanthanide element of the Periodic Table of the Elements, specifically M is at least one metal element selected from Ag, Au, Pd, Mg, Al, Ge, In, Ga, Cd, Yb, and Eu.

Specifically, M is at least one metal element selected from a metal element of Groups 10-13, more specifically M is at least one metal element selected from Al, Pd, Au, and Ga.

According to an embodiment, the x and y are respectively in the following ranges: $0.001\le x\le 0.1$ and $0.001\le y\le 0.05$.

According to another embodiment, the x and y are respectively in the following ranges: $0.005\le x\le 0.1$ and $0.001\le y\le 0.01$.

According to an embodiment, the z is in a range of $0\le z\le 0.5$, but is not limited thereto, and may be in all composition ranges for a Bi—Te—Se-based thermoelectric material. In an embodiment, z is $0.05\le z\le 0.45$, specifically $0.1\le z\le 0.4$.

The performance of a thermoelectric material may be represented by ZT, which is defined in the following Equation 1, and is called a dimensionless figure of merit.

$$ZT = \frac{S^2 \sigma T}{k} \qquad \text{Equation 1}$$

In Equation 1, the Z is a figure of merit, the S is Seebeck coefficient, the σ is electrical conductivity, the T is an absolute temperature, and the κ is thermal conductivity.

As shown in Equation 1, a thermoelectric material may have a ZT that is increased by increasing a Seebeck coefficient and electrical conductivity. Thus ZT may be increased by increasing a power factor ($S^2\sigma$) and decreasing thermal conductivity.

However, since the Seebeck coefficient and electrical conductivity usually have a trade-off relationship in which one increases while the other decreases depending on a concentration change of charge carriers, i.e., electrons or holes, increases in the power factor are usually limited.

In the later 1990's, remarkable development of nano-structuralization technology made it possible to manufacture a super lattice thin film, a nanowire, a quantum dot, and the like, which have high thermoelectric figures of merit because of the phonon-glass-electron crystal (PGEC) effect, which provides for a decrease in thermal conductivity while maintaining a power factor, or because of a quantum confinement effect, which destroys the trade-off relationship between electrical conductivity and the Seebeck coefficient.

The quantum confinement effect provides for increasing the Seebeck coefficient while not substantially changing the electrical conductivity, thereby breaking the trade-off relationship between electrical conductivity and Seebeck coefficient by expanding the density of states (DOS) of a carrier inside a material to increase the effective mass. The PGEC effect provides for a decrease in thermal conductivity but not electrical conductivity by blocking movement of phonons that transport the heat while not substantially hindering the movement of a carrier.

However, most nano-structured materials with suitably high efficiency are made into a thin film and are not yet practically used due to limited bulking technology.

A thermoelectric material used for cooling or a heat pump at around room temperature (about 300 K) in general has p-type and n-type compositions represented by $(Bi_{1-x}Sb_x)_2(Te_{1-y}Se_y)_3$. In particular, the n-type thermoelectric material composition has the general formula $Bi_2(Te,Se)_3$.

As for the n-type thermoelectric material composition, a polycrystalline n-type bulk material has a maximum thermoelectric figure of merit ZT of about 0.9 at about 300 K, which is about a half of that of a p-type material.

In particular, an n-type Bi—Te(Se)-based material has poor reproducibility and thus is not commercially available, since it is very hard to control a Te vacancy produced during the bulk production process.

In addition, the properties of a n-type thermoelectric material may be selected by selecting a ratio between Te and Se. However, the ratio between Te and Se is both difficult to select in a process of controlling carrier density and tuning properties, and also a small ratio difference may result is vastly changed properties and a sharply decreased power factor.

In an embodiment, and while not wanting to be bound by theory, the disclosed thermoelectric material provides an enhanced power factor by firstly providing a Cu doped Bi—Te—Se based n-type material having suitably reproducible properties by doping a Bi—Te—Se-based alloy material with the small amount of a Cu metal and positioning the Cu metal in the lattice of the Bi—Te—Se-based alloy material to suppress production of non-uniform Te vacancies and have the Cu metal function as a donor. Then, by doping the Cu-doped Bi—Te—Se-based n-type material with a heterogeneous element, particularly, an effective metal M, the Fermi energy level of the Cu-doped Bi—Te—Se-based n-type material may be moved to a selected energy.

More specifically, a thermoelectric material of Chemical Formula 1:

$$M_xCu_yBi_{2-x}(Te_{1-z}Se_z)_3 \qquad (1)$$

may have an increased power factor, and thus may have an enhanced thermoelectric figure of merit by doping the small amount of an effective metal M in a Cu doped $Bi_2(Te, Se)_3$-based thermoelectric material. While not wanting to be bound by theory, it is understood that the enhanced thermoelectric figure of merit occurs because the doped element M is substituted for the Bi and subtly changes the charge density and chemical potential, and thus suitably controls the Fermi energy level.

Therefore, the thermoelectric material according to an embodiment is an n-type thermoelectric material with higher efficiency than a conventional n-type Bi—Te—Se-based thermoelectric material. While not wanting to be bound by theory, it is understood that the improved efficiency is provided by doping a heterogeneous element M and changing the chemical potential of the material, and thus changing the power factor (a product of electrical conductivity and Seebeck coefficient) and increasing the thermoelectric figure of merit.

Specifically, it is believed that the doped effective metal element M moves the Fermi energy level of the thermoelectric material toward a direction of increasing its effective mass in the density of states, and provides a high power factor by controlling the carrier density, and thus electrical conductivity and the Seebeck coefficient, and resultantly increases the thermoelectric figure of merit.

Accordingly, the thermoelectric material according to an embodiment has a chemical potential difference of less than or equal to about 1 electron volt (eV) compared with a thermoelectric material having x=0 in the above chemical formula.

Furthermore, the thermoelectric material according to an embodiment has a chemical potential difference of less than or equal to about 0.6 eV compared with a thermoelectric material having x=0 in the above chemical formula.

In addition, the thermoelectric material according to an embodiment may have charge density ranging from about $1\times10^{19}$ per cubic centimeter ($cm^{-3}$) to about $10\times10^{19}$ $cm^{-3}$ at 300 K.

Since the thermoelectric material according to the embodiment has an increased figure of merit not by nano-structuralizing but by selecting its composition, the thermoelectric figure of merit (ZT) may be further increased by applying a nano-structuralization method thereto to provide a nano-structured material, e.g., super lattice thin film, a nanowire, or a quantum dot. Details of the nano-structuralization method can be determined by one of skill in the art without undue experimentation.

According to another embodiment, a method of producing the thermoelectric material is provided. The thermoelectric material may be prepared by any suitable method.

The method may include the following methods, the details of which can be determined by one of skill in the art without undue experimentation.

The method may include an ampoule method wherein a starting material, e.g., elements in a predetermined ratio, are disposed in an ampoule made of quartz or a metal, the ampoule sealed under vacuum, and then heat-treated to provide the thermoelectric material.

The method may include an arc-melting method wherein a starting material, e.g., elements in a predetermined ratio, are disposed in a chamber and an arc discharged thereon under an inert gas atmosphere to melt the starting material and prepare the thermoelectric material.

The method may include solid state reaction method wherein starting materials in a suitable form, e.g., powders, are combined (e.g., mixed) in a predetermined ratio to provide a mixture, the mixture may be optionally processed to provide a solid (e.g., pressed to provide a pellet), and then the mixture or solid heat-treated and optionally sintered to prepare the thermoelectric material.

The method may include a metal flux method which includes disposing a starting material, e.g., elements in a predetermined ratio, and another element or compound, which is a suitable flux for the starting material or a product thereof, to provide a mixture in a container, and heat-treating the mixture to prepare the thermoelectric material. This method may be suitable to grow a crystal of the thermoelectric material.

The method may include a Bridgman method which includes disposing a starting material, e.g., elements, in a predetermined ratio in a container, heating the end of the container at a high temperature until the starting material melts, and slowly moving the heated region of the container to locally melt a portion until the specimen is evenly heated to prepare the thermoelectric material. This method may be suitable for growing a crystal of the thermoelectric material.

The method may include an optical floating zone method which includes providing a starting material, e.g., elements in a predetermined ratio, in a seed rod and a feed rod, then locally melting the feed rod at a high temperature by focusing a light on a portion of the feed rod prepare the thermoelectric material. The method may be suitable for growing a crystal by slowly moving the floating zone, i.e., the melted portion at the end of the feed rod.

The method may include a vapor transport method which includes disposing a starting material, e.g., elements in a predetermined ratio, at the bottom of a container, e.g., a quartz tube, heating the starting material while keeping the top of the quartz tube at a lower temperature, and forming the thermoelectric material, e.g., growing a crystal of the thermoelectric material, when the starting material is gasified and has a solid-phase reaction at the lower temperature.

The method may include a mechanically-alloying method which includes disposing a starting material in the form of a powder and steel balls in a container made of a hard metal alloy or ceramic material, and agitating, e.g., spinning, the container to make the steel balls mechanically impact the starting material powder to prepare the thermoelectric material. In an embodiment, an alloy-type thermoelectric material is provided.

The foregoing and other suitable methods of preparing the thermoelectric material, the details of which can be determined by one of skill in the art without undue experimentation, are provided in the Springer Handbook of Crystal Growth, Govindhan Dhanaraj, Kullaiah Byrappa, Vishwanath Prasad, and Michael Dudley, Eds., Springer-Verlag, 2010, the content of which in its entirety is herein incorporated by reference.

According to another embodiment a thermoelectric device including the thermoelectric material is provided. The thermoelectric device may comprise the thermoelectric material in a suitable form, e.g., in the form of a bar or a rod.

According to an embodiment, the thermoelectric device may be fabricated by using a starting material having a suitable composition to prepare the thermoelectric material powder and sintering the thermoelectric material powder under pressure to form the thermoelectric device.

In particular, a starting material having an overall composition of the thermoelectric material may be combined, e.g., mixed and melted, to fabricate an ingot. The ingot may be ground and pressure-sintered in a spark plasma sintering method, to provide a bulk thermoelectric material having the composition. The bulk thermoelectric material may be used to provide a thermoelectric device.

Specifically, a starting material to provide the metal element M in Chemical Formula 1, which can be at least one metal element selected from Groups 2, 10-14, and a lanthanide element, specifically at least one metal element selected from Ag, Au, Pd, Mg, Al, Ge, In, Ga, Cd, Yb, and Eu, Cu, Bi, Te, and Se, is provided, e.g., weighed, to provide an amount suitable to provide the compound of Chemical Formula 1

$$M_xCu_yBi_{2-x}(Te_{1-z}Se_z)_3 \tag{1}$$

and disposed in a quartz tube, the quartz tube sealed under vacuum, and heated at a temperature ranging from about 800 to 1400° C., specifically about 1000 to 1200° C., in a furnace for about 5 to 20 hours, specifically about 10 to 15 hours to melt the starting material.

Then, the quartz tube may be quenched with water to prepare an ingot-shaped alloy material, and the ingot-shaped alloy material may be ground into powder using ball mill. The powder may be pressure-sintered, e.g., by spark-plasma sintering, to fabricate a bulk thermoelectric device.

Figure 5:
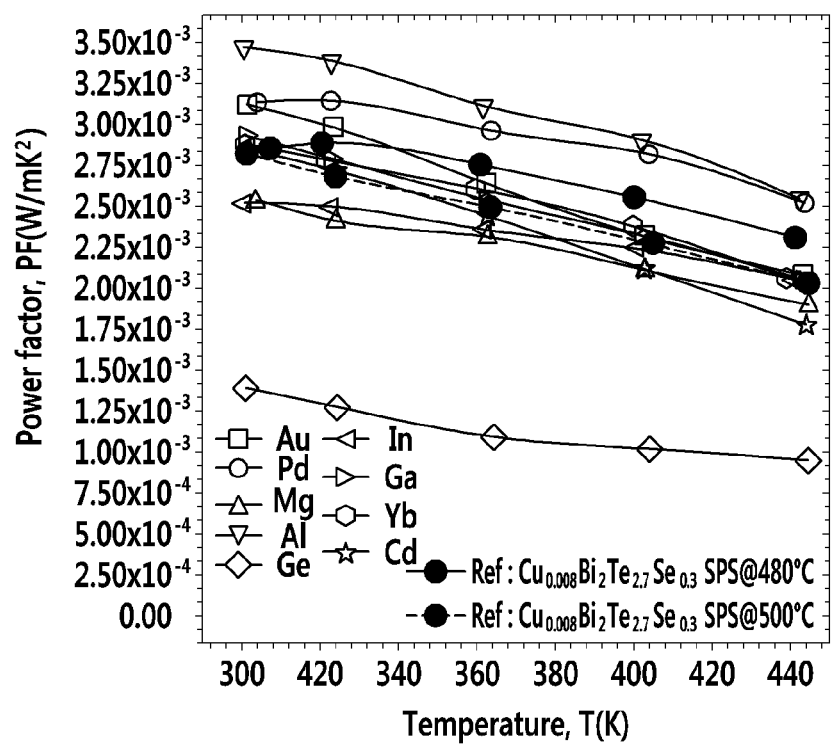
FIG. 5 is a graph of power factor (Watts per meter-square Kelvin, W/mK²) versus temperature (Kelvin, K) for the thermoelectric material of the formula $M_xCu_yBi_{2-x}(Te_{1-z}Se_z)_3$ wherein M is Au, Pd, Al, Mg, Ga, Ge, In, Yb, or Cd, x=0.02, y=0.008, and z=0.1.

The thermoelectric device according to the embodiment has an increased power factor at 300 K to 440 K as compared with a material having a composition where x=0 in Chemical Formula 1, as shown in FIG. 5.

Figure 6:
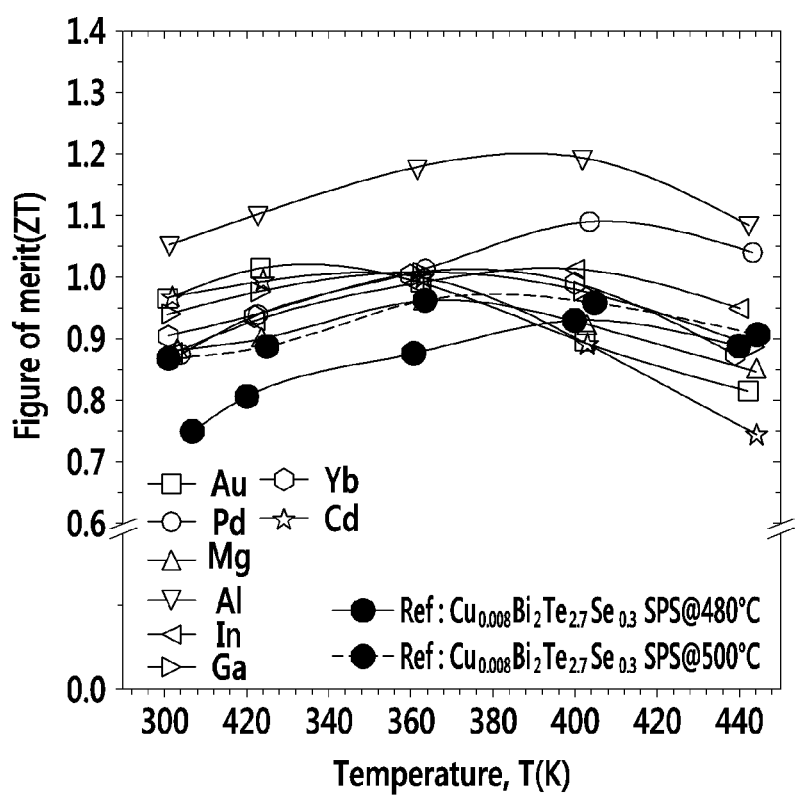
FIG. 6 is a graph of thermoelectric figure of merit (ZT) versus temperature (Kelvin, K) for the thermoelectric material of the formula $M_xCu_yBi_{2-x}(Te_{1-z}Se_z)_3$ wherein M is Au, Pd, Al, Mg, Ga, Ge, In, Yb, or Cd, x=0.02, y=0.008, and z=0.1.
Figure 7:
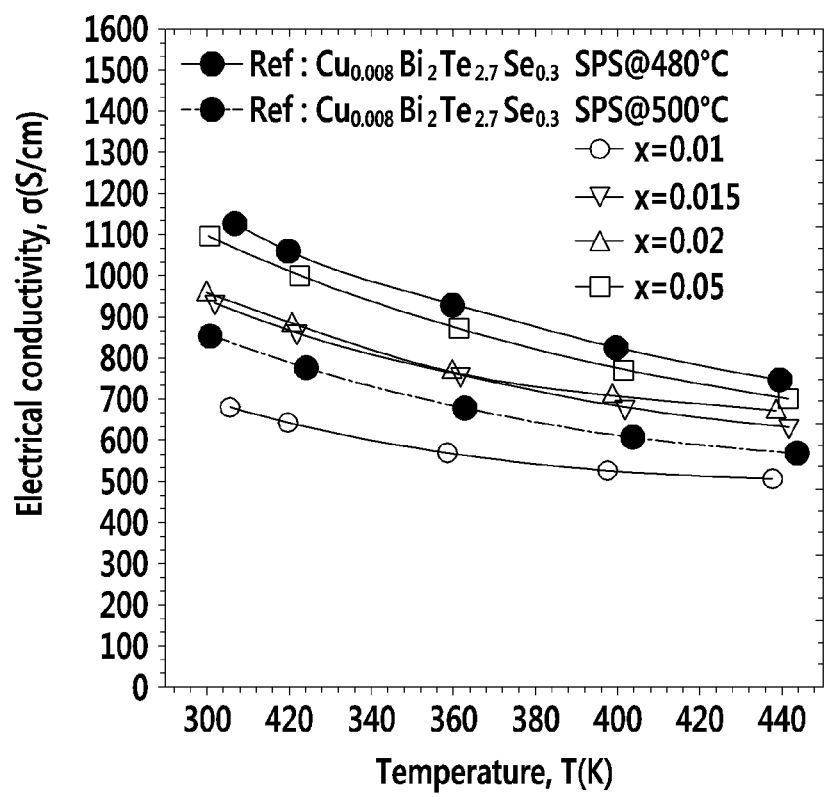
FIG. 7 is a graph of electrical conductivity (Siemens per centimeter, S/cm) versus temperature (Kelvin, K) for the thermoelectric material $M_xCu_yBi_{2-x}(Te_{1-z}Se_z)_3$ wherein, when M is Al, y=0.008, and z=0.3 and the addition amount x of Al is 0.01, 0.015, 0.02, or 0.05.
Figure 8:
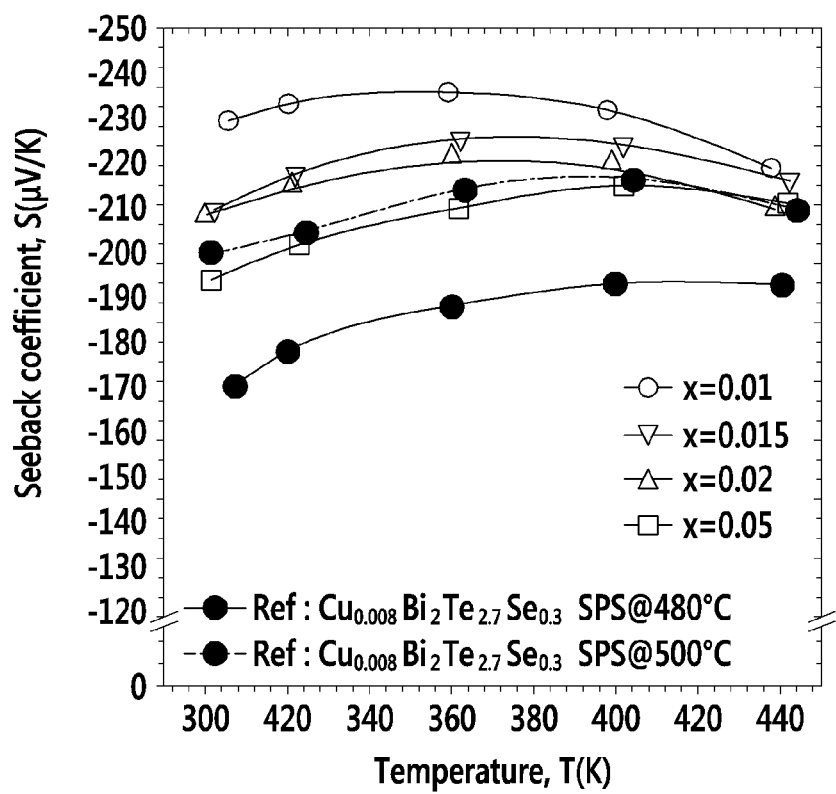
FIG. 8 is a graph of Seebeck coefficient (microvolts per Kelvin, μV/K) versus temperature (Kelvin, K) for the thermoelectric material $M_xCu_yBi_{2-x}(Te_{1-z}Se_z)_3$ wherein, when M is Al, y=0.008, and z=0.3 and the addition amount x of Al is 0.01, 0.015, 0.02, or 0.05.

For example, when M in Chemical Formula 1 is Al and is included, e.g., doped, in an amount such that x=0.02, the thermoelectric material has a ZT (thermoelectric figure of merit) of about 1.2 at 400 K, which is an increase of about 28% compared with $Cu_{0.008}Bi_2Te_{2.7}Se_{0.3}$ as shown in FIG. 6.

While not wanting to be bound by theory, it is understood that the doped Al changes the chemical potential of $Cu_{0.008}Bi_2Te_{2.7}Se_{0.3}$ and moves the Fermi energy level towards a larger effective mass, and thus increases the power factor of the material.

In other words, it is understood that an effective metal element M doped in a small amount changes the charge density and the Fermi energy level and thus the effective mass, resulting in a change to the electrical conductivity, the Seebeck coefficient, and the power factor. In addition, the electrical conductivity that is changed by the charge density changes the charge contribution to the thermal conductivity and as a result, changes the thermal conductivity.

In addition, another embodiment provides a thermoelectric module including the thermoelectric device. An embodiment of the thermoelectric module including the thermoelectric device is shown in FIG. 17.

Figure 17:
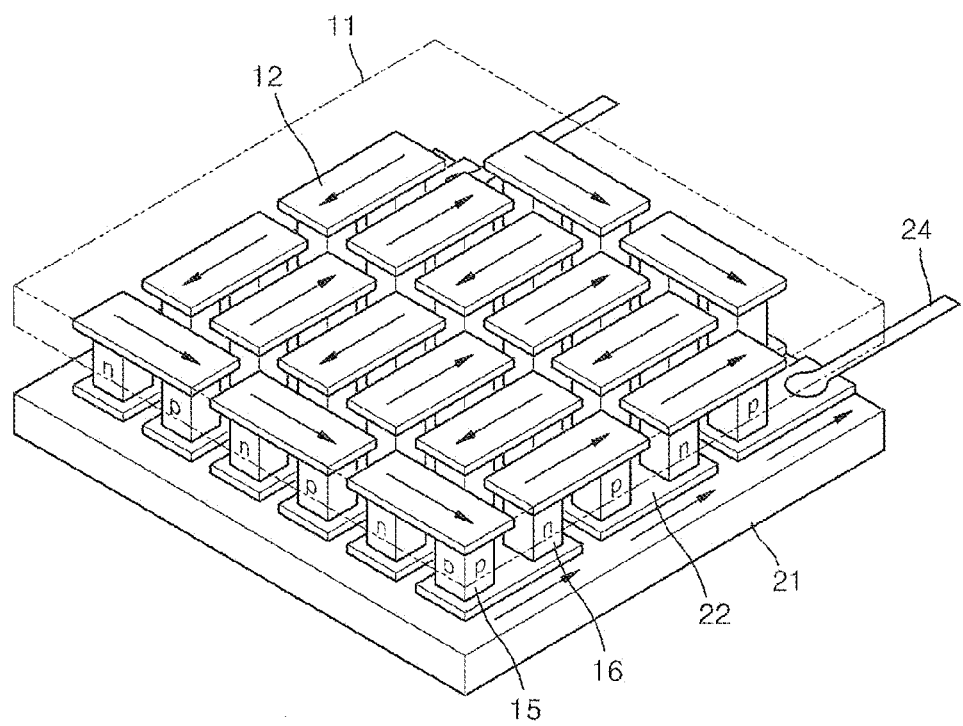
FIG. 17 illustrates an embodiment of a thermoelectric module.

As shown in FIG. 17, an upper electrode 12 and a lower electrode 22 are patterned respectively on an upper insulating substrate 11 and a lower insulating substrate 21, and a p-type thermoelectric device 15 and an n-type thermoelectric device 16 mutually contact the upper electrode 12 and the lower electrode 22. The upper and lower electrodes 22 are electrically connected to the outside of the thermoelectric module via a lead electrode 24.

The upper and lower insulating substrates 11 and 21 may comprise at least one selected from gallium arsenic (GaAs), sapphire, silicon, PYREX, and quartz. Also, the upper and lower electrodes 12 and 22 may comprise at least one selected from aluminum, nickel, gold, and titanium. The upper and lower electrodes may have any suitable size. The upper and lower electrodes 12 and 22 may be patterned using any suitable patterning method, such as a lift-off semiconductor method, a deposition method, or a photolithography method.

Alternatively, a thermoelectric module may include a first electrode, a second electrode, and the thermoelectric device comprising the thermoelectric material comprising the compound of Chemical Formula 1 between the first and second electrodes. The thermoelectric module may further include an insulating substrate on which at least one of the first and second electrodes is disposed. The insulating substrate may be one of the upper and lower insulating substrates 11 and 21 as shown in FIG. 1.

In a thermoelectric module according to an embodiment, the first and second electrodes may be electrically connected to a power supply source.

As shown in FIG. 1, a thermoelectric module according to an embodiment may include a p-type thermoelectric device and an n-type thermoelectric device that are alternately arranged, wherein at least one of the p-type thermoelectric device and the n-type thermoelectric device includes the thermoelectric material.

In an embodiment, one of the first electrode and the second electrode may be exposed to a heat supply source. In another embodiment, one of the first electrode and the second electrode may be electrically connected to a power supply source or electrically connected to an electrical device (for example, battery) which consumes or stores electric power.

Hereinafter, an embodiment is further illustrated with specific examples. However, these examples are exemplary and shall not limit the scope of the present disclosure.

Example 1

Preparation of $M_xCu_yBi_{2-x}(Te_{1-z}Se_z)_3$-Based Thermoelectric Material Powder Powders having the formula $M_xCu_yBi_{2-x}(Te_{1-z}Se_z)_3$ (y=0.008, z=0.1) wherein M is Au, Pd, Al, Mg, Ga, Ge, In, Yb, or Cd and x=0.02, to provide an $M_xCu_yBi_{2-x}(Te_{1-z}Se_z)_3$-based thermoelectric material powder doped with an effective metal element M, is prepared by respectively adding a metal element, i.e., Au, Pd, Al, Mg, Ga, Ge, In, Yb, or Cd, such that x=0.02, in a melting method.

First, an ingot-shaped alloy raw material is prepared by respectively weighing a starting metal element M (i.e., Au, Pd, Al, Mg, Ga, Ge, In, Yb, or Cd), Cu, Bi, Te, and Se as starting materials for $M_xCu_yBi_{2-x}(Te_{1-z}Se_z)_3$ according to the composition, putting a mixture of the starting materials in a quartz tube having a diameter of 12 millimeters (mm), sealing the quartz tube under vacuum of $10^{-3}$ torr, putting the sealed quartz tube in a furnace, maintaining the quartz tube at 1100° C. for 12 hours, and then quenching it from 700° C. to room temperature to produce the alloy raw material in a shape of ingot.

The ingot is ground with a ball mill, and sorted with a wire screen (325 mesh) to obtain $M_xCu_yBi_{2-x}(Te_{1-z}Se_z)_3$ powder with a size of less than or equal to about 45 microns wherein M is Au, Pd, Al, Mg, Ga, Ge, In, Yb, or Cd, x=0.02, y=0.00, and z=0.1.

Example 2

Preparation of $M_xCu_yBi_{2-x}(Te_{1-z}Se_z)_3$-Based Thermoelectric Material

The thermoelectric material powder having the formula $M_{0.02}Cu_{0.008}Bi_{1.98}Te_{2.7}Se_{0.3}$ according to Example 1 is pressure-sintered at a maximum temperature of 500° C. for 2 minutes with an applied pressure of 40 megaPascals (MPa) under a vacuum in a spark-plasma sintering method, producing a bulk thermoelectric material.

The bulk thermoelectric material is evaluated for the thermoelectric figure of merit. The results of the evaluation are provided in FIGS. 1 to 6, which also provide results for a reference composition of the formula $Cu_{0.008}Bi_2Te_{2.7}Se_{0.3}$ for comparison.

Herein, the electrical conductivity of the bulk thermoelectric material is evaluated using ZEM-3 equipment made by Ulvac-Riko Inc. in a conventional DC 4-probe method at about 300 K to about 440 K. The Seebeck coefficient is determined using a steady-state method.

The power factor of the bulk thermoelectric material is $S^2\sigma$ as shown in the aforementioned Equation 1, and is calculated by multiplying the electrical conductivity by the Seebeck coefficient.

Then, the thermal conductivity of the bulky thermoelectric material is calculated using heat capacity measured in a thermal relaxation method, thermal diffusivity under vacuum in a laser-flash method using TC-9000 equipment made by Ulvac-Riko Inc., and bulk density of a thermoelectric device of the thermoelectric material.

The lattice thermal conductivity of the bulk thermoelectric material is obtained by subtracting the thermal conductivity of electrons calculated by the Wiedemann-Franz law using the electrical conductivity and the Seebeck coefficient from the entire thermal conductivity.

As shown in FIG. 5, as a result of evaluating effects of each effective element after fixing the doping amount of the effective element M to be x=0.02, the power factor is increased over all the temperatures when the M is Al, Pd, Au, or Ga, compared with a reference composition, that is, a thermoelectric material including no effective element M, e.g., $Cu_{0.008}Bi_2Te_{2.7}Se_{0.3}$.

The maximum figure of merit (ZT) of the bulk thermoelectric material shown in FIG. 6 is 1.2 at 400 K when Al is doped as x=0.02, which is about 28% more than the reference composition, $Cu_{0.008}Bi_2Te_{2.7}Se_{0.3}$.

While not wanting to be bound by theory, it is believed that the reason for the improved performance is that the Al doped in a small amount changes the chemical potential of $Cu_{0.008}Bi_2Te_{2.7}Se_{0.3}$ and moves the Fermi energy level toward a large effective mass, and thus increases the power factor (see FIG. 5).

In conclusion, when an effective element (M) is included, the power factor of a bulk thermoelectric material is increased as compared with a reference composition without the effective element M, e.g., $Cu_{0.008}Bi_2Te_{2.7}Se_{0.3}$. Also, the power factor is unexpectedly increased in the order of Al>Pd>Au>Ga.

The maximum power factor increase shown in FIG. 5 is 3.41 mW/mK$^2$ at 300 K when Al is doped, which is about 21% higher than the reference composition, $Cu_{0.008}Bi_2Te_{2.7}Se_{0.3}$.

As for thermal conductivity, a bulk thermoelectric material doped with an effective element M has up to 20% decreased thermal conductivity around room temperature (300 K) compared with a material not doped with an effective element M.

Figure 4:
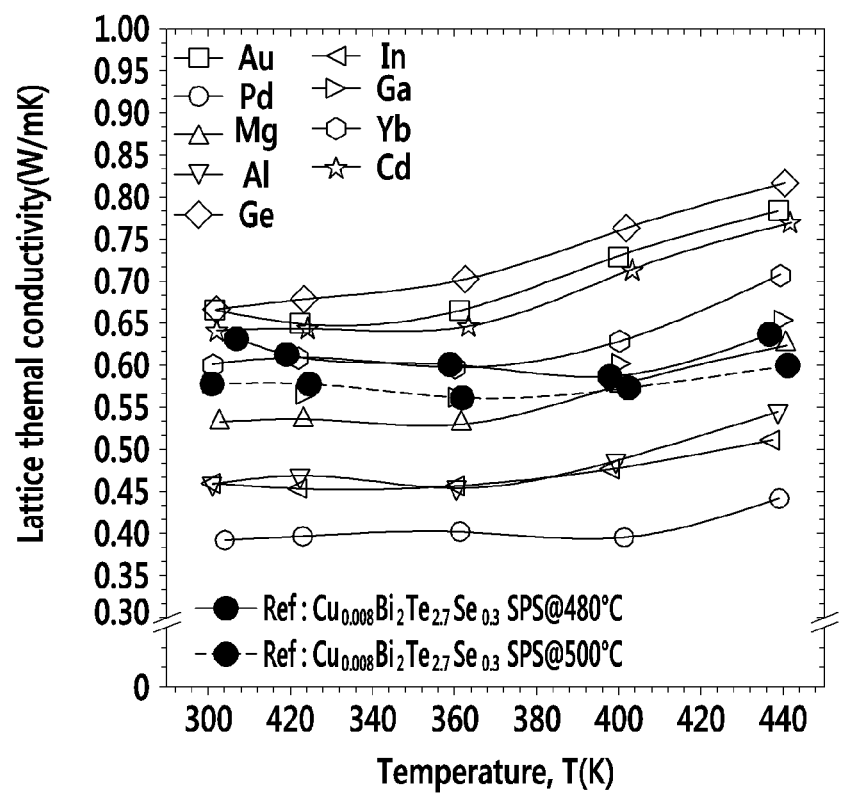
FIG. 4 is a graph of lattice thermal conductivity (Watts per milliKelvin, W/mK) versus temperature (Kelvin, K) for the thermoelectric material of the formula $M_xCu_yBi_{2-x}(Te_{1-z}Se_z)_3$ wherein M is Au, Pd, Al, Mg, Ga, Ge, In, Yb, or Cd, x=0.02, y=0.008, and z=0.1.

In particular, the bulk thermoelectric materials disclose herein have remarkably decreased lattice thermal conductivity except for the those doped with Au and Ge, sharply increasing the Seebeck coefficient (see FIG. 4).

In addition, as shown in FIG. 6, the material doped with the aforementioned metal element has a better thermoelectric figure of merit (ZT) in a region ranging from 300 to 440 K than the reference composition.

While not wanting to be bound by theory, it has been surprisingly found that Au, Ge, Ga, and Mg highly control the Seebeck coefficient, and Pd, Pd, Al, and In effectively control electrical conductivity, when used as M in Chemical Formula 1.

Example 3

Evaluation of Thermoelectric Properties of $Al_x$-$Cu_yBi_{2-x}(Te_{1-z}Se_z)_3$ Thermoelectric Material Depending on the Amount of Al Referring to the result of Example 2, a thermoelectric material including Al, which has the highest thermoelectric figure of merit (ZT) over the temperature range 300 K to 440 K, is prepared to have a composition of the formula $Al_xCu_{0.008}Bi_{2-x}Te_{2.7}Se_{0.3}$ by selecting the amount of the Al to be x=0.01, 0.015, 0.02, or 0.05, and is evaluated for the thermoelectric properties depending on the amount of the Al.

In particular, a bulk thermoelectric material having a composition of the formula $Al_xCu_{0.008}Bi_{2-x}Te_{2.7}Se_{0.3}$ and including different amounts of Al is prepared by weighing an effective metal element Al and a starting material, such as Cu, Bi, Te, and Se according to each composition having a different x to prepare the thermoelectric material powder according to Example 1, and then sintering the thermoelectric material powder with pressure in a spark-plasma sintering method according to Example 2.

The bulk thermoelectric materials including different additions of Al are evaluated for thermoelectric properties at various temperatures and compared with a reference composition, $Cu_{0.008}Bi_2Te_{2.7}Se_{0.3}$. The results are provided in FIGS. 7 to 12.

Figure 9:
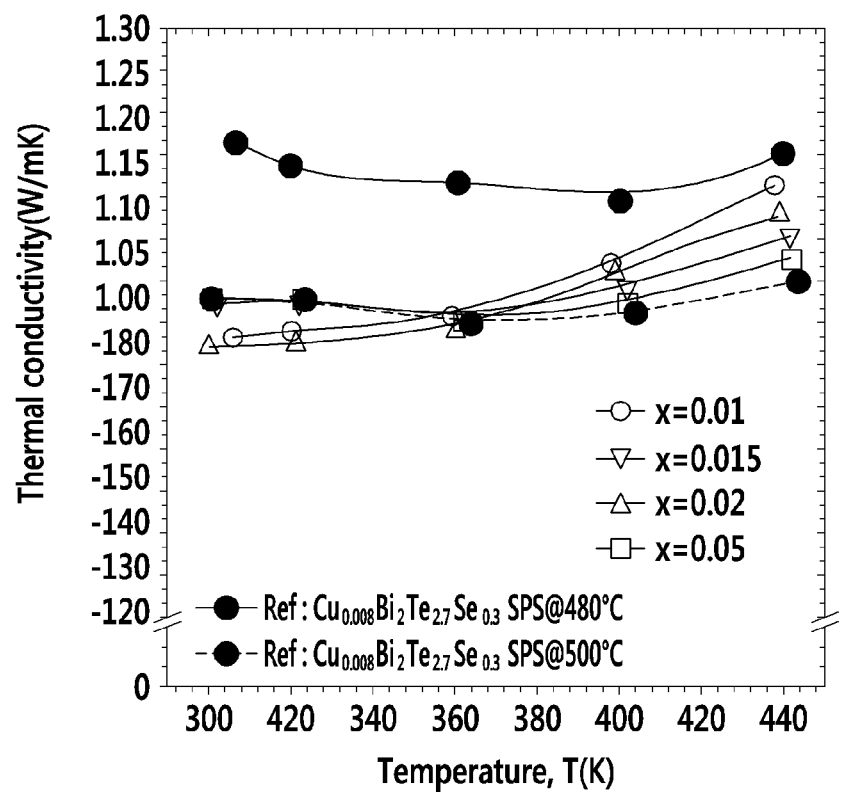
FIG. 9 is a graph of thermal conductivity (Watts per milliKelvin, W/mK) versus temperature (Kelvin, K) for the thermoelectric material $M_xCu_yBi_{2-x}(Te_{1-z}Se_z)_3$ wherein, when M is Al, y=0.008, and z=0.3 and the addition amount x of Al is 0.01, 0.015, 0.02, or 0.05.
Figure 10:
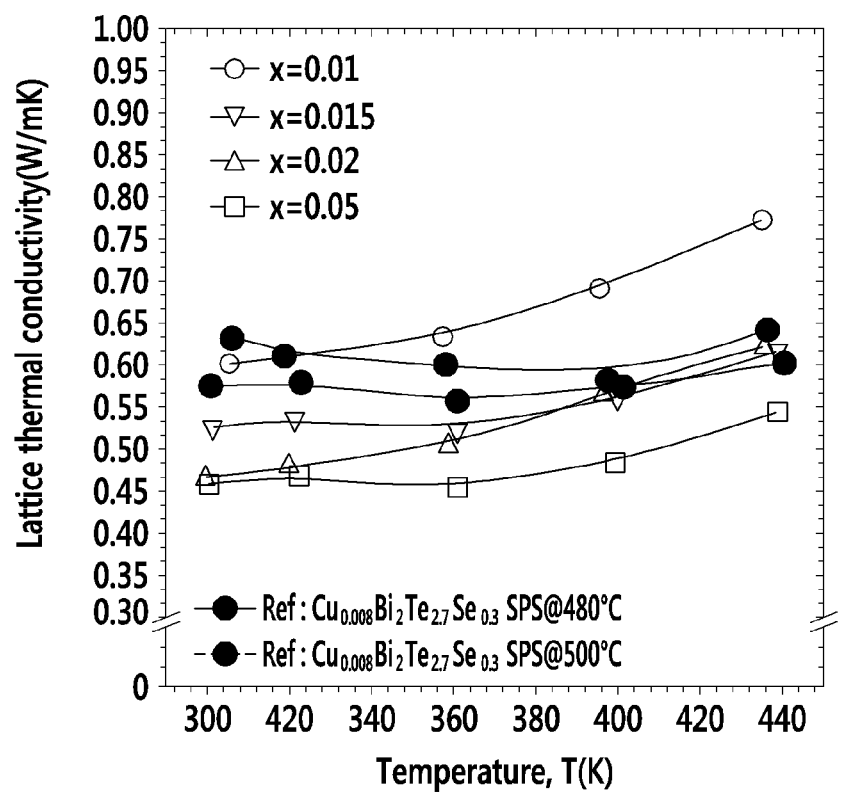
FIG. 10 is a graph of lattice thermal conductivity (Watts per milliKelvin, W/mK) versus temperature (Kelvin, K) for the thermoelectric material $M_xCu_yBi_{2-x}(Te_{1-z}Se_z)_3$ wherein, when M is Al, y=0.008, and z=0.3 and the addition amount x of Al is 0.01, 0.015, 0.02, or 0.05.

As shown in FIGS. 7 to 12, the thermoelectric materials including Al over all of the Al addition range have unexpectedly increased Seebeck coefficients compared with the reference composition, $Cu_{0.008}Bi_2Te_{2.7}Se_{0.3}$ (see FIG. 8), and surprisingly decreased thermal conductivity compared with the reference composition, $Cu_{0.008}Bi_2Te_{2.7}Se_{0.3}$ at a temperature of less than or equal to about 360 K (see FIG. 9). The lattice thermal conductivity is also surprisingly decreased as shown in FIG. 10.

Figure 11:
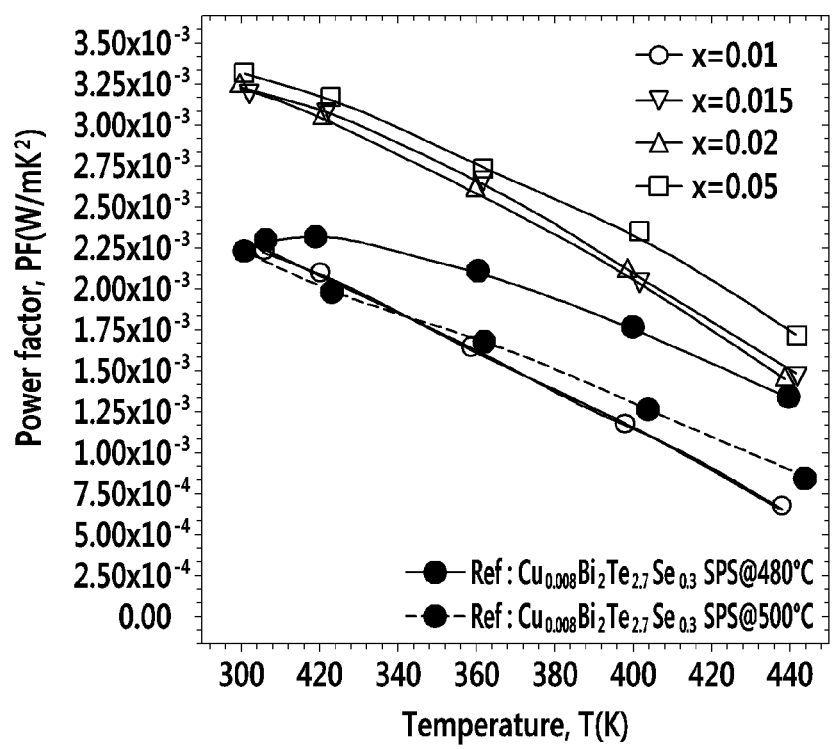
FIG. 11 is a graph of power factor (Watts per meter-square Kelvin, $W/mK^2$) for the thermoelectric material $M_xCu_yBi_{2-x}(Te_{1-z}Se_z)_3$ wherein, when M is Al, y=0.008, and z=0.3 and the addition amount x of Al is 0.01, 0.015, 0.02, or 0.05.
Figure 12:
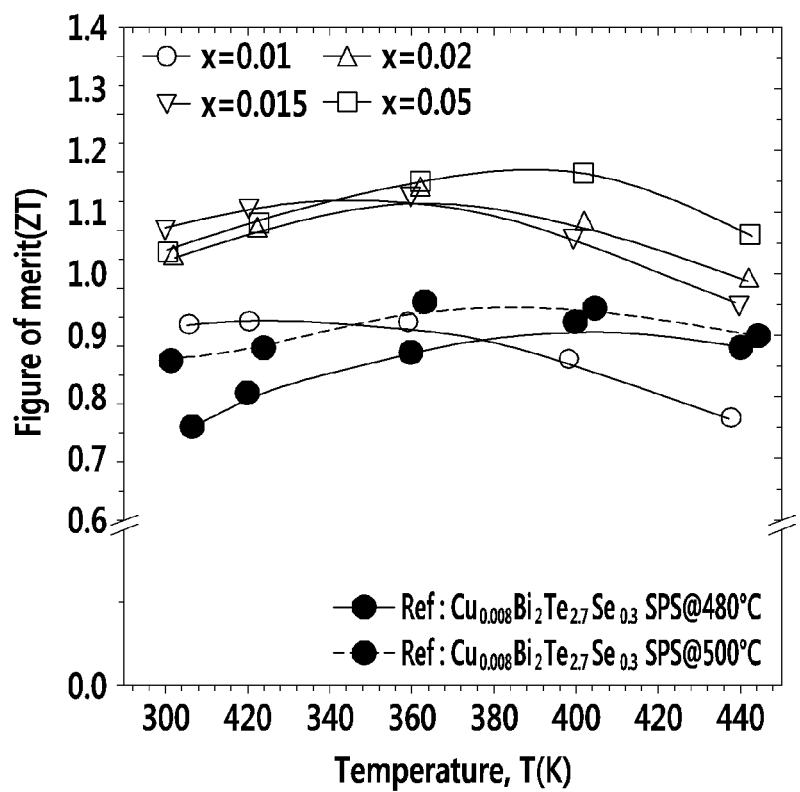
FIG. 12 is a graph of thermoelectric figure of merit (ZT) versus temperature (Kelvin, K) for the thermoelectric material $M_xCu_yBi_{2-x}(Te_{1-z}Se_z)_3$ wherein, when M is Al, y=0.008, and z=0.3 and the addition amount x of Al is 0.01, 0.015, 0.02, or 0.05.

As shown in the results, the thermoelectric materials including Al in all ranges except for x=0.01 have a remarkably increased power factor in all the temperature regions compared with the reference composition (see FIG. 11). In addition, the thermoelectric materials including Al, even in an amount of 0.01 as well as in all the other amounts of Al, have a sharply increased thermoelectric figure of merit (ZT) at 300-340 K, as well at room temperature (see FIG. 12).

Figure 13:
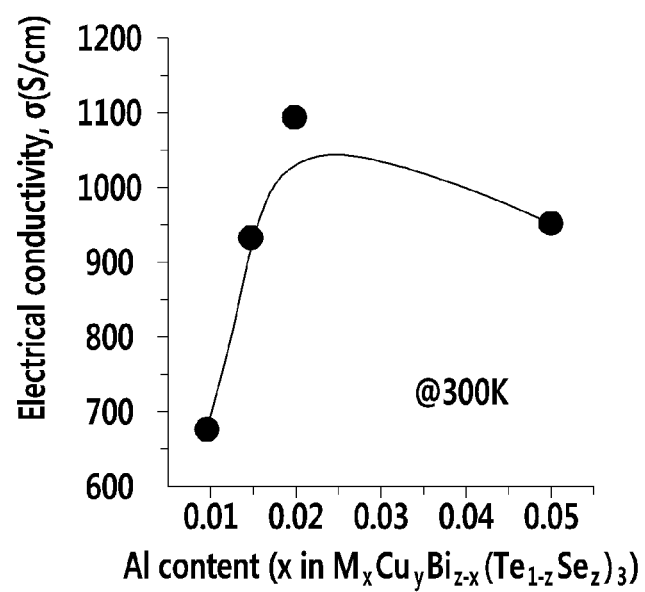
FIG. 13 is a graph of electrical conductivity (Siemens per centimeter, S/cm) versus Al content (x in $M_xCu_yBi_{2-x}(Te_{1-z}Se_z)_3$) at 300 K for the thermoelectric material $M_xCu_yBi_{2-x}(Te_{1-z}Se_z)_3$ wherein M is Al, and x=0.01, 0.015, 0.02, or 0.05, y=0.008, and z=0.3 at 300 K.
Figure 14:
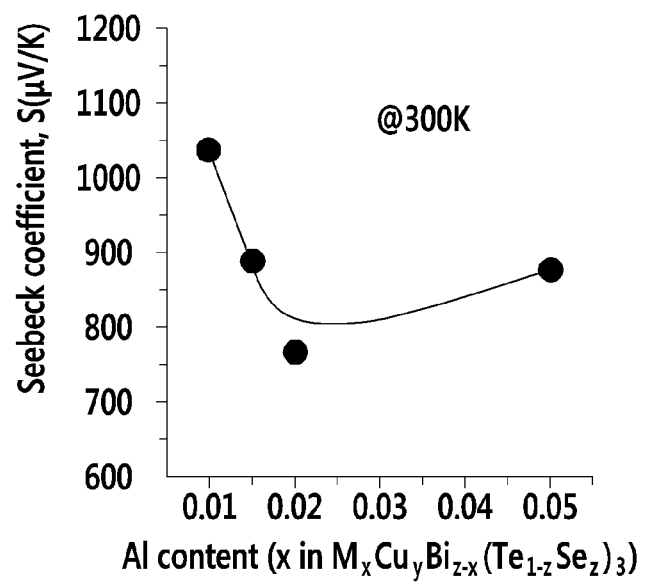
FIG. 14 is a graph of Seebeck coefficient (microvolts per Kelvin, μV/K) at 300 K versus Al content (x in $M_xCu_yBi_{2-x}(Te_{1-z}Se_z)_3$) for the thermoelectric material $M_xCu_yBi_{2-x}(Te_{1-z}Se_z)_3$ wherein M is Al, and x=0.01, 0.015, 0.02, or 0.05, y=0.008, and z=0.3.
Figure 15:
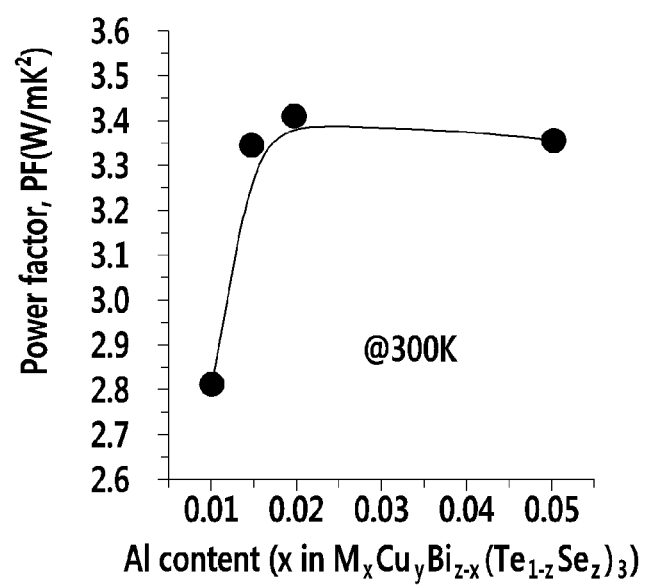
FIG. 15 is a graph of power factor (Watts per meter-square Kelvin, $W/mK^2$) at 300 K versus Al content (x in $M_xCu_yBi_{2-x}(Te_{1-z}Se_z)_3$) for the thermoelectric material $M_xCu_yBi_{2-x}(Te_{1-z}Se_z)_3$ wherein M is Al, and x=0.01, 0.015, 0.02, or 0.05, y=0.008, and z=0.3.
Figure 16:
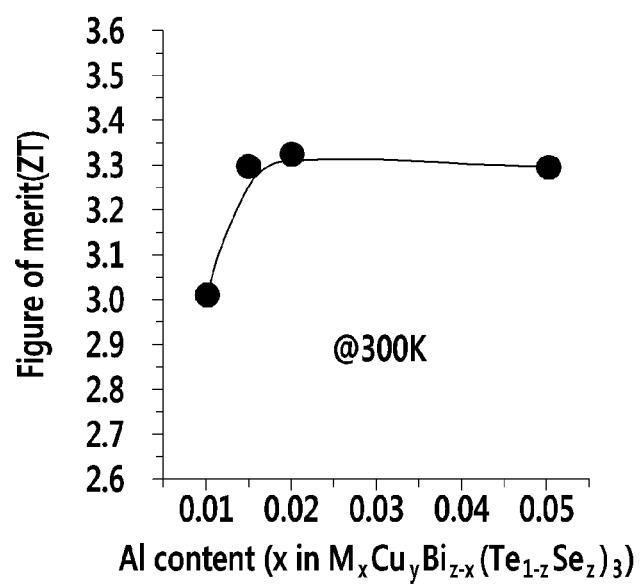
FIG. 16 is a graph of maximum thermoelectric figure of merit (ZT) at 300 K versus Al content (x in $M_xCu_yBi_{2-x}(Te_{1-z}Se_z)_3$) for the thermoelectric material $M_xCu_yBi_{2-x}(Te_{1-z}Se_z)_3$ wherein M is Al, and x=0.01, 0.015, 0.02, or 0.05, y=0.008, and z=0.3.

FIGS. 13 to 16 are graphs showing thermoelectric properties of the thermoelectric materials of the formula $Al_xCu_y$-$Bi_{2-x}(Te_{1-z}Se_z)_3$ wherein x=0.01, 0.015, 0.02, or 0.05, y=0.008, and z=0.3, showing changes according to the addition amounts of Al around room temperature. FIG. 13 shows electrical conductivity at 300 K according to the addition amounts of Al, FIG. 14 shows a Seebeck coefficient at 300 K according to the addition amounts of Al, FIG. 15 shows a power factor at 300 K according to the addition amounts of Al, and FIG. 16 shows a thermoelectric figure of merit (ZT) at 300 K according to the addition amounts of Al.

As shown in FIGS. 13 to 16, the thermoelectric materials have sharply increased power factor all over the Al addition ranges except for an Al addition amount of 0.01 around room temperature of 300 K regardless of the Al addition amounts, and also an unexpectedly increased figure of merit (ZT) at a temperature of 300 K over all the Al addition ranges compared with the reference composition.

Accordingly, an n-type Bi—Te—Se-based thermoelectric material comprising a small amount of an effective metal element M and having a composition according to the formula $M_xCu_yBi_{2-x}(Te_{1-z}Se_z)_3$ has a chemical potential that is changed by the effective metal element and a Fermi energy level that is moved toward a larger effective mass, and thus has an increased power factor, and in particular improved thermoelectric properties at about 300 K to about 400 K, including around room temperature.

Therefore, the thermoelectric material according to an embodiment may be suitable to provide a cooling system, e.g., a refrigerator, air conditioner, or integrated circuit cooler, or an electrical generator system which uses discharged heat, and the like.

While this disclosure has been described in connection with what is presently considered to be a practical exemplary embodiment, it is to be understood that the invention is not limited to the disclosed embodiment, but, on the contrary, includes various modifications and equivalent arrangements included within the spirit and scope of the appended claims. Descriptions of features, advantages, or aspects within each embodiment shall be considered as available for other similar features, advantages, or aspects in other embodiments.

What is claimed is:

1. A thermoelectric material comprising:
a compound represented by Chemical Formula 1

$$M_xCu_yBi_{2-x}(Te_{1-z}Se_z)_3 \tag{1}$$

wherein in Chemical Formula 1,
M is at least one metal element, and
x, y, and z independently satisfy the ranges $0<x\leq0.1$, $0<y\leq0.05$, and $0\leq z\leq0.5$.

2. The thermoelectric material of claim 1, wherein the M is at least one metal element selected from Ag, Au, Pd, Mg, Al, Ge, In, Ga, Cd, Yb, and Eu.

3. The thermoelectric material of claim 1, wherein the M is at least one metal element selected from Al, Pd, Au, and Ga.

4. The thermoelectric material of claim 1, wherein the x is in a range of $0.001\leq x\leq0.1$, and the y is in a range of $0.001\leq y\leq0.05$.

5. The thermoelectric material of claim 1, wherein the x is in a range of $0.005\leq x\leq0.1$, and the y is in a range of $0.001\leq y\leq0.01$.

6. The thermoelectric material of claim 1, wherein a difference between a chemical potential of the thermoelectric material and a chemical potential of a thermoelectric material having x=0 in Chemical Formula 1 is less than or equal to about 1 electron volt.

7. The thermoelectric material of claim 1, wherein a difference between a chemical potential of the thermoelectric material and a chemical potential of a thermoelectric material having x=0 in Chemical Formula 1 is less than or equal to about 0.6 electron volt.

8. The thermoelectric material of claim 1, wherein the thermoelectric material has charge density ranging from about $1\times10^{19}$ per cubic centimeter to about $10\times10^{19}$ per cubic centimeter at 300 Kelvin.

9. A thermoelectric device comprising the thermoelectric material according to claim 1.

10. A thermoelectric module comprising the thermoelectric device according to claim 9.

11. The thermoelectric material of claim 1, wherein the M is at least one metal element selected from Groups 1-10 and 12-13 of the Periodic Table of the Elements, Ag, Au, and a lanthanide.

12. The thermoelectric material of claim 11, wherein the M is at least one metal element selected from of Groups 2, 10, and 12-13 of the Periodic Table of the Elements, Ag, Au, and a lanthanide.

* * * * *